United States Patent [19]

Skutch, Jr.

[11] 4,360,780
[45] Nov. 23, 1982

[54] DUAL VOLTAGE BATTERY TESTER

[76] Inventor: William G. Skutch, Jr., 2444 Edgehill Rd., Toledo, Ohio 43615

[21] Appl. No.: 316,751

[22] Filed: Oct. 30, 1981

[51] Int. Cl.³ .......................................... G01N 27/42
[52] U.S. Cl. .................................. 324/437; 324/435; 324/158 F
[58] Field of Search .................... 324/435, 437, 158 F, 324/426

[56] References Cited

U.S. PATENT DOCUMENTS

| | | | |
|---|---|---|---|
| 1,337,160 | 4/1920 | Riebeth | 324/437 |
| 2,602,096 | 7/1952 | Gilbert | 324/435 |
| 2,708,735 | 5/1953 | Sparr . | |
| 3,736,498 | 5/1973 | Skutch | 324/437 |
| 4,204,161 | 5/1980 | Strickland . | |

OTHER PUBLICATIONS

Mueller, "The Gould Battery Handbook", 1973, pp. 21, 22 and 27.

*Primary Examiner*—Michael J. Tokar
*Attorney, Agent, or Firm*—Wilson, Fraser, Barker & Clemens

[57] ABSTRACT

A battery tester adaptable for testing both 1.5 and 9 volt batteries is disclosed. The tester includes an indicator lamp carried by an arm extending over a base which receives the battery to be tested. The arm is attached to a plunger, vertically slidable within a stem connected to the base. A bias spring urges the arm to an uppermost position on the stem. Conductive means on the base, stem, plunger, and arm provides a partial circuit between the lamp and a first pole of a cylindrical 1.5 volt battery in contact with the base. A resistive terminal is attached to the arm near the indicator lamp. Depression of the arm from its uppermost positions places a protruding terminal on the lamp in contact with a second pole of either a cylindrical or rectangular battery. Such depression of the arm also places the terminal secured on the arm in contact with a first pole of a rectangular battery. Thus, a circuit is completed between either type of battery and the lamp.

6 Claims, 4 Drawing Figures

U.S. Patent    Nov. 23, 1982    4,360,780
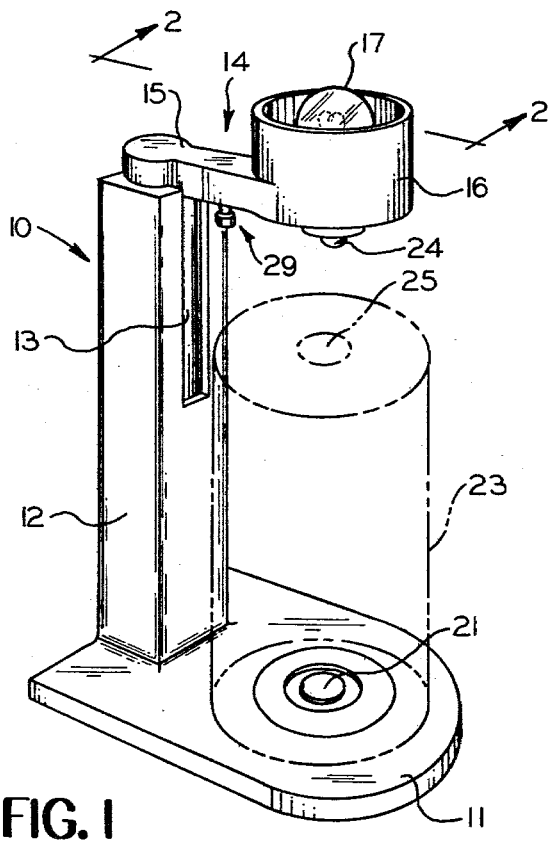
FIG. 1
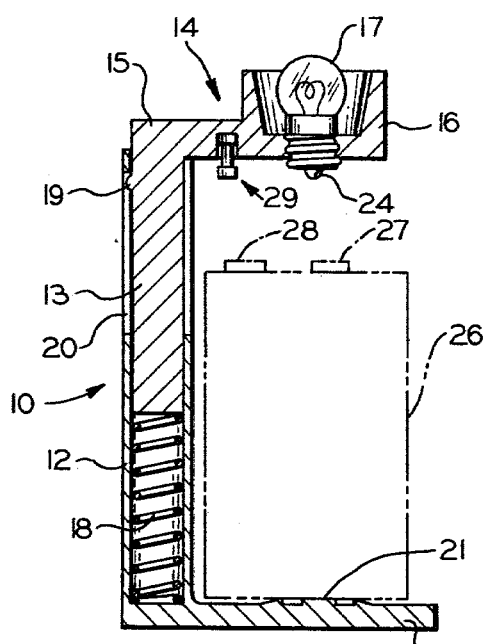
FIG. 2
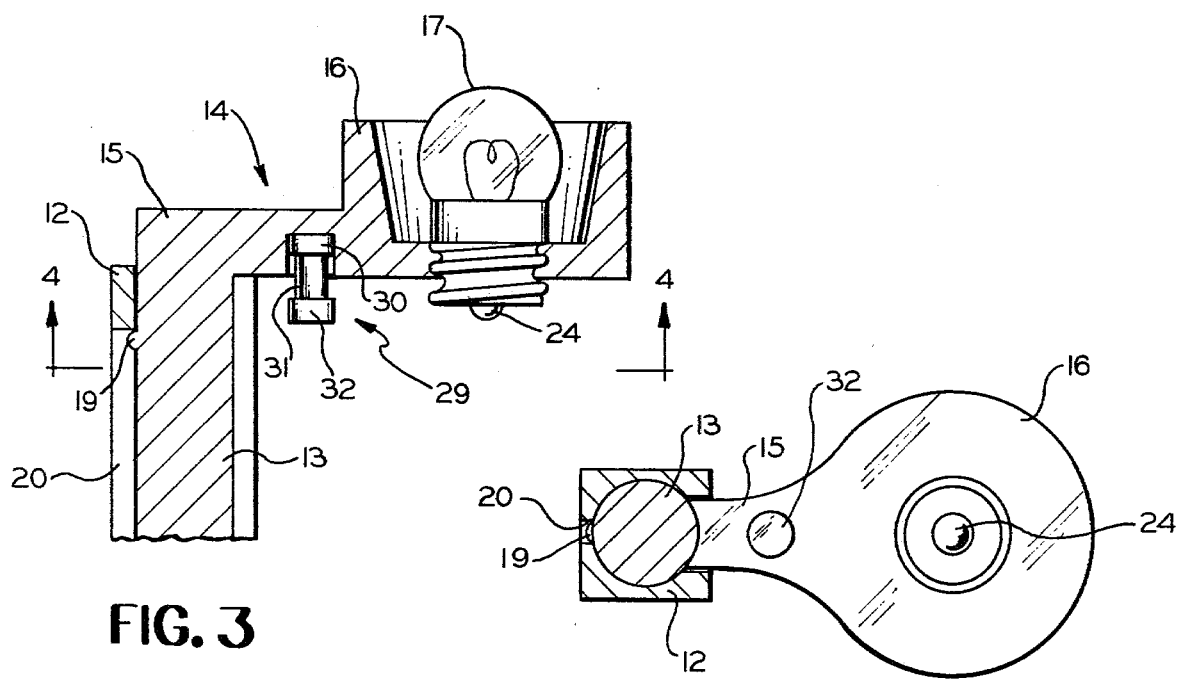
FIG. 3
FIG. 4

DUAL VOLTAGE BATTERY TESTER

BACKGROUND OF THE INVENTION

1. Field of the Invention

The present invention relates in general to battery testing devices and in particular to a simple and inexpensive battery tester which will accommodate any size of 1.5 volt and 9 volt batteries.

2. Description of the Prior Art

Dry cell batteries are manufactured in many different standard sizes. Typically, 1.5 volt batteries are cylindrical in shape and have a positive terminal or pole and a negative terminal or pole located at opposite ends of the cylinder. On the other hand, 9 volt batteries are generally shaped in the form of a rectangular parallelepiped, with both the positive and negative poles located on the same face. Batteries such as these are commonly stored in wholesale and retail outlets for a number of months prior to sale. Improper storage during this time or storage for long periods can cause the batteries to lose their stored electrical energy. Also, faulty construction can cause power loss in the batteries prior to use and discharge through normal use will render batteries weak or nonusable. It has therefore been desirable to provide a simple and inexpensive battery tester for use in a retail store or a home which will accommodate any size of commercial dry cell battery and which can be quickly and simply used, even by a child, to indicate the condition of a battery or set of batteries.

My U.S. Pat. No. 3,736,498 discloses a battery tester for a 1.5 volt cylindrical battery. The battery tester includes an indicator lamp carried by an arm extending over a base which receives a battery to be tested. The arm is attached to a plunger, vertically slidable within a stem connected to the base. Conductive means on the base, stem, plunger, and arm provide a partial circuit between the lamp and a lower negative pole of the battery in contact with the base. Depression of the arm from its uppermost position places a rotating terminal on the lamp in contact with an upper positive pole on the battery, thereby completing the circuit between the battery and the lamp. This device is simple and easy to operate but will work only batteries of one voltage and with the terminals or poles at opposed ends of the cylindrical body, as is the case with 1.5 volt flashlight type batteries. Other battery testers are shown in U.S. Pat. Nos. 2,155,778, 2,205,316, 2,833,984 and 3,395,809, but each of these will accommodate only a battery of a single voltage having oppositely-facing terminals like the common 1.5 volt flashlight battery.

SUMMARY OF THE INVENTION

The present invention relates to a battery tester for various sizes of both 1.5 volt and 9 volt batteries. The tester includes a base having a terminal for contacting a lower negative pole of a 1.5 volt battery. A vertical stem, connected to the base, receives a plunger in axial sliding contact therewith. A bias spring between the base and a lower end of the plunger urges the plunger to an uppermost position on the stem. A horizontal socketed arm, extending from an upper end of the plunger, carries a test lamp above the terminal on the base. A contact on the test lamp, threadably attached to the horizontal arm, protrudes through the arm toward the base. Depression of the plunger from its uppermost position toward the base carries the test lamp on the horizontal arm into electrical contact with an upper positive pole of the 1.5 volt battery on the base. The base, stem, plunger, and horizontal arm can be formed of a conductive material which completes the electrical test circuit between the battery and the test lamp when the lamp is depressed into contact with the battery. As thus far described, the construction and operation of the device is similar to that disclosed in my aforementioned '498 patent.

The horizontal socketed arm also carries an electrically resistive pin terminal which extends downwardly from the arm the same distance as the contact on the test lamp. The pin terminal is located away from the test lamp contact the same distance as the standard distance between the positive and negative terminals of a 9 volt battery. Depression of the plunger from its uppermost position towards the base carries the test lamp and the pin terminal into electrical contact with the positive and negative terminals of the 9 volt battery, respectively, thereby completing the test circuit. The electrical resistance of the pin provides the necessary voltage drop so that a single bulb can be used for both 1.5 and 9 volt batteries.

It is an object of the present invention to provide a battery tester which can accommodate various standard sizes of both 1.5 volt and 9 volt batteries.

It is another object of the present invention to provide a simple and inexpensive battery tester which can be used interchangeably with both types of batteries without modification or changes in test procedures.

Other objects and advantages of the present invention will become apparent to those skilled in the art from the following detailed description of the preferred embodiment of the invention, when read in light of the accompanying drawings.

BRIEF DESCRIPTION OF THE DRAWINGS

FIG. 1 is a perspective view of a battery tester in accordance with the present invention;

FIG. 2 is an elevational sectional view taken along line 2—2 of the battery tester of FIG. 1;

FIG. 3 is a close-up cross-sectional view of the upper portion of the battery tester of FIG. 2; and FIG. 4 is a bottom sectional view of the upper portion, taken along line 4—4 of FIG. 3.

DETAILED DESCRIPTION OF THE PREFERRED EMBODIMENT

There is illustrated in FIG. 1 a battery tester 10 having a base 11, a stem 12 connected to or made integral with the base 11, a plunger 13 in axial sliding contact with the stem 12, and a horizontal arm 14 secured to and extending at a right angle to the stem 12. The arm 14 includes a beam member 15 and a socket member 16 for threadably receiving an indicator lamp 17. The socket member 16 has a dish-shaped socket which receives the indicator lamp 17 therein. The indicator lamp 17 is partially recessed within the socket to protect it but to make illumination of the lamp 17 readily visible. A bias spring 18 within the stem 12 between the base 11 and a lower end of the plunger 13 urges the plunger 13 upwardly, holding the horizontal socketed arm 14 at an uppermost position over the base 11 as shown in FIG. 1. As shown in FIGS. 2–4, a guide pin 19 attached to the plunger 13 rides within a guide track 20 formed on the stem 12. The guide pin thus limits the axial movement of the plunger 13 within the stem 12 so that the plunger 13 will not be pushed out of the stem 12 beyond its uppermost position by the spring 18.

The base 11 is provided with a raised central portion 21 for receiving and contacting a lower or negative pole of a 1.5 volt battery 23 to be tested. A center contact 24 of the indicator lamp 17 protrudes through the socket member 16 over the axial center of the base 11. Thus, when a 1.5 volt battery 23, shown in broken line in FIG. 1, is placed on the base 11 in contact with the raised portion 21, the center contact 24 of the indicator lamp 17 is axially aligned over an upper or positive pole 25 of the battery 23.

Depression of the horizonal socket arm 14 carries the bulb contact 24 into electrical connection with the positive pole 25 of the battery 23. The base 11, stem 12, plunger 13, and the horizontal socketed arm 14 of the battery tester can be formed of any suitable electrically conductive material or, in a different embodiment, a conductive coating on a plastic body, whereby contact of the battery poles 22 and 25 as described creates an electrical circuit between the battery 23 and the indicator lamp 17. Completion of the circuit will cause the battery 23 to illuminate the indicator lamp 17, the intensity of the lamp being proportional to the amount of electrical energy in the battery 23. As is well known to battery users, a dead or discharged battery will fail to light the lamp 17.

Because the center contact of the indicator lamp is axially aligned over the raised portion 21 of the base 11 and is vertically adjustable, the battery tester 10 can receive many varying dimensions and heights of cylindrical 1.5 volt batteries to be tested. Thus, large D cells and even small AAA cells which have the same nominal output voltage can be checked with equal facility.

FIGS. 2 and 3 illustrate how the present invention can be used to test a rectangular 9 volt battery 26, shown in broken line. The 9 volt battery 26 has a positive pole 27 and a negative pole 28, both of which are located on the upper surface of the battery 26. The horizontal socketed arm 14 carries a resistive pin terminal 29 in an aperture formed therein. The pin terminal 29 includes an upper metallic cap 30, a body 31 formed of a semiconductor material, and a lower metallic cap 32. The pin terminal 29 is secured to the horizontal socketed arm by a suitable adhesive or is press fit in the aperture such that the upper metallic cap 30 is placed in electrical contact with the conductive portion of the arm 14. The pin terminal 29 is positioned in the horizontal arm 14 such that the bottom end of the lower metallic cap 32 extends downwardly from the horizontal arm 14 the same distance as the bottom end of the center contact 24 of the indicator lamp 17. Furthermore, the pin terminal 29 is laterally positioned in the arm 14 such that when the arm is depressed downwardly and the contact 24 is placed into connection with the positive pole 27 of the battery 26, the lower metallic cap 32 of the pin terminal 29 will contact the negative terminal 28 of the battery 26. Thus, the circuit will be completed and the battery 26 will illuminate the indicator lamp 17. The resistive body 31 of the pin terminal 29 causes a voltage drop thereacross to protect the indicator lamp 17 from the excess voltage generated by the 9 volt battery 26, as opposed to the 1.5 volt battery 23. Reversal of either of the batteries 23 or 26 makes no difference since the circuit is not voltage biased and will work regardless of polarity, etc.

It will be seen from the above description of a preferred embodiment that the dual voltage battery tester of this invention is of simple construction, easy to use, and does not require a different procedure for either type of battery. This is particularly important since battery testers of this nature are often operated by children without adult supervision and does not require an understanding of the voltages involved, the type of battery being tested, or the ability to read a meter, etc. As an additional aid to facilitate use by this invention by persons having no skills, such as children, the base 11 could also be provided with an imprint or recess of a rectangular shape to indicate to the user how a 9 volt battery is to be placed in the tester, for proper alignment with the contacts 24 and 29.

As previously stated, the test circuitry for either the 1.5 or 9 volt batteries is completed through the structure of the tester itself. While the tester can be fabricated from a conductive material, such as metal, it is preferred that the tester be fabricated of inexpensive thermoplastic parts, which are normally nonconductive, and then coated with a conductive coating to provide the necessary conductive current paths. This has the advantage of inexpensive construction and also makes the tester physically attractive with a metallized appearance.

It will be seen from the above description of the preferred embodiment that the present invention provides a means for testing of commonly used household batteries of several voltages using a single inexpensive bulb and is foolproof to the extent that it cannot be improperly used to damage or burnout the single bulb with excessive voltage. While the above described preferred embodiment has been set forth in terms of 1.5 and 9 volt batteries, those skilled in the art will recognize that other commonly used batteries of different voltage can be accommodated by the incorporation of appropriate resistors and positioning of resistor contacts in the circuitry so that proper contact with the proper terminal is assured and uniform voltage is applied across the test lamp to assure its long life. Additionally, it will be appreciated that extremely small or otherwise irregularily-shaped batteries can be tested by utilizing conventional conductive extenders to electrically connect the poles or terminals of the battery to the contacts of the battery tester. Various other modifications may be made to the above described preferred embodiment by those skilled in the art without departing from the spirit and scope of the following claims.

What is claimed is:

1. An apparatus adaptable for alternatively testing a battery shaped as a cylinder, wherein the cylindrical battery has a first pole and a second pole disposed on opposite ends of the cylinder, and a battery shaped as a rectangular parallelepiped, wherein the rectangular battery has a first pole and a second pole disposed on the same face of the parallelepiped, comprising:
   a base;
   means on said base for establishing electrical contact with the first pole of a cylindrical battery placed thereon;
   a hollow stem connected to said base having a lower end and an upper end, said stem defining a receiving chamber in said lower end;
   a plunger positioned in said receiving station in axial sliding contact with said stem;
   resilient means urging said plunger toward an uppermost position;
   a horizontal arm connected to an upper end of said plunger and extending over said base;

a terminal on said horizontal arm and in electrical contact therewith, said terminal including a resistive body formed of a semiconductor material having an upper metallic end and a lower metallic end, whereby said upper metallic end is in electrical contact with said horizontal arm and said lower metallic end is placed into electrical contact with the first pole of a rectangular battery when said center contact of said test lamp is placed into electrical contact with the second pole of the rectangular battery when said horizontal arm is moved downwardly;

a test lamp on said horizontal arm and in electrical contact therewith; and means on said horizontal arm for establishing electrical contact between said terminal and a first pole of a rectangular battery placed on said base and for establishing electrical contact between a center contact of said test lamp and a second pole of a cylindrical or rectangular battery placed on said base; said base, said stem, said plunger, and said horizontal arm comprising an electrically conductive material whereby the downward movement of said horizontal arm, carried by said plunger, creates an electrical circuit between the cylindrical or rectangular battery being tested and said lamp for testing the output of the battery.

2. A battery tester in accordance with claim 1 further including a guide pin attached to said plunger extending through slot means formed on said stem for limiting axial travel of said plunger.

3. A battery tester in accordance with claim 1 wherein said means on said horizontal arm for establishing electrical contact between said test lamp and said second pole of the cylindrical or rectangular battery comprises a threaded open socket member for threadably receiving said test lamp, a contact of said test lamp protruding through said socket member above the cylindrical or rectangular battery, whereby lowering of said horizontal arm connected to said plunger places said contact of said test lamp against the second pole of the cylindrical or rectangular battery.

4. A battery test device adapted for use with batteries of more than one voltage and size, said device including a single indicator responsive to a voltage applied across its terminals, means for positioning said indicator including movable arm and electrical contact with one terminal of said indicator and effective to suspend the other terminal of said indicator above a fixed base, conductive means in said fixed base for making contact with a battery terminal of a first battery type, circuit means extending from said fixed base to said one terminal of said indicator means whereby movement of said arm towards said base will effect contact of said suspended other terminal with the other battery terminal of said first battery type to close the circuit with said first battery type and said indicator, alternate contact means carried by said arm laterally spaced from said indicator whereby movement of said arm towards said base will effect contact of said alternate contact means and said suspended other terminal of said indicator across the laterally spaced apart terminals of a second battery type to close the circuit with said indicator and said second battery type, and an electrically resistive element incorporated within said device within the closed circuit of one of said battery types and effective to adjust the voltage across said indicator from said one battery type to the approximate value of said other battery type.

5. The battery test device of claim 4 wherein said electrically resistive element is a resistor having one terminal engaged with and in electrical contact with said moveable arm and the other terminal suspended below said arm laterally spaced from and in horizontal alignment with said suspended terminal of said indicator.

6. The battery test device of claim 4 wherein said movable arm is positioned in an upper remote position by a resilient means and is movable to a lower contacting position against the force of said resilient means.

* * * * *